United States Patent
Schie

(10) Patent No.: US 9,692,376 B2
(45) Date of Patent: Jun. 27, 2017

(54) CONTROLLED SWITCHED CAPACITOR COEFFICIENTS

(71) Applicant: David Schie, Cupertino, CA (US)

(72) Inventor: David Schie, Cupertino, CA (US)

( * ) Notice: Subject to any disclaimer, the term of this patent is extended or adjusted under 35 U.S.C. 154(b) by 381 days.

(21) Appl. No.: 14/214,709

(22) Filed: Mar. 15, 2014

(65) Prior Publication Data
US 2014/0339897 A1 Nov. 20, 2014

Related U.S. Application Data

(60) Provisional application No. 61/787,717, filed on Mar. 15, 2013.

(51) Int. Cl.
| | |
|---|---|
| *H02J 7/34* | (2006.01) |
| *H02J 1/10* | (2006.01) |
| *H02J 3/38* | (2006.01) |
| *H03F 3/45* | (2006.01) |
| *H03K 5/00* | (2006.01) |

(52) U.S. Cl.
CPC ........... *H03F 3/45475* (2013.01); *H03K 5/00* (2013.01); *H03F 2203/45514* (2013.01); *H03F 2203/45551* (2013.01); *Y10T 307/549* (2015.04)

(58) Field of Classification Search
CPC ..... G11C 27/026; G11C 27/024; G11C 27/00; H03M 1/12; H03M 1/145; H02M 1/46; H02M 3/07; H02M 3/00; H02M 1/00
USPC ......... 307/52, 82, 43, 66, 64, 80; 324/76.11, 324/111; 323/282, 283, 284, 285, 351; 341/172, 146; 327/536, 96; 375/350
See application file for complete search history.

(56) References Cited

U.S. PATENT DOCUMENTS

| | | | |
|---|---|---|---|
| 6,169,444 B1* | 1/2001 | Thurber, Jr. | H02M 3/07 327/536 |
| 2005/0219097 A1* | 10/2005 | Atriss | H03M 1/162 341/144 |
| 2007/0024267 A1* | 2/2007 | Lee | G11C 27/026 324/76.11 |
| 2007/0035335 A1* | 2/2007 | Lee | G11C 27/024 327/94 |
| 2007/0237273 A1* | 10/2007 | Tan | H03H 11/1291 375/350 |
| 2009/0201051 A1* | 8/2009 | Ono | G11C 27/026 327/96 |

(Continued)

*Primary Examiner* — Rexford Barnie
*Assistant Examiner* — Jagdeep Dhillon
(74) *Attorney, Agent, or Firm* — Weiss & Moy, P.C.; Jeffrey D. Moy

(57) ABSTRACT

A switched capacitor circuit including two or more capacitors arranged in a switched capacitor circuit configuration with a comparator comparing a node whose potential varies with the charging of one or more of the switched capacitors. The switched capacitor circuit also has two or more current sources scaled relative to one another coupled to the capacitors and to the comparator, where the current from one current source charges at least two of the capacitors in series during the charge portion of the cycle, and the other current source charges at least one of but at least one fewer of the capacitor(s) during the charge portion of the cycle, and where the current sources are enabled at the beginning of the charge portion of the cycle, but where the comparator disables the current sources once the node reaches a reference potential.

20 Claims, 22 Drawing Sheets

(56) References Cited

U.S. PATENT DOCUMENTS

2009/0267650 A1* 10/2009 Lee ................. G11C 27/026
                                              327/50
2013/0082684 A1*  4/2013 Spalding, Jr. ......... G01R 15/06
                                              324/111

* cited by examiner

| 8th Order HP (Switch L's and C's) | | | fc=0.48Hz |
|---|---|---|---|
| L1 | 2.265607 | 7.414182019 | 7.41418E-12 |
| C2 | 1.095559 | 3.585209277 | 3.58521E-12 |
| L3 | 0.8695 | 2.845433315 | 2.84543E-12 |
| C4 | 0.730257 | 2.389759312 | 2.38976E-12 |
| L5 | 0.593573 | 1.942462043 | 1.94246E-12 |
| C6 | 0.440922 | 1.442914332 | 1.44291E-12 |
| L7 | 0.271911 | 0.889825741 | 8.89826E-13 |
| C8 | 0.091906 | 0.300760201 | 3.0076E-13 |

| 6th Order LP | | | fc=150Hz |
|---|---|---|---|
| C1 | 2.264524 | 0.002402734 | 2.40273E-12 |
| L2 | 1.112643 | 0.001180551 | 1.18055E-12 |
| C3 | 0.853786 | 0.000905895 | 9.05895E-13 |
| L4 | 0.639155 | 0.000678165 | 6.78165E-13 |
| C5 | 0.40019 | 0.000424615 | 4.24615E-13 |
| L6 | 0.136492 | 0.000144823 | 1.44823E-13 |

FIG. 13

$$V_{X_{PI}2} = \frac{V_{cm}}{2} - \frac{\Delta V}{2} - \Delta Q_C \Big/ C$$

$$= \frac{V_{cm}}{2} - \frac{\Delta V}{2} - \frac{\left(-\frac{\Delta Q_C}{2} + \frac{V_{cm}}{2} - C\right)}{C}$$

$$= \frac{V_{cm}}{2} - \frac{\Delta V}{2} + \frac{\frac{Q_C}{2} - \frac{V_{cm}}{2}}{C} - C$$

$$= \frac{V_{cm}}{2} - \frac{\Delta V}{2} + \frac{\Delta V + V_{cm}}{2} - \frac{V_{cm}}{2} - \frac{V_{cm}}{2}$$

P2 $V_{X_{PI}} = V_{cm} + Q_{C_{1n}} - Q_{C_{2n}}$ $Q_{C_{1n}} = V_{C_1}C - (I_1 + I_2)\Delta t$  $Q_{C_{in}2} = \frac{V_{in}C + V_{cm}C - I_2\Delta t}{2}$ $$= \frac{1}{2}V_{in}C - (I_1 + I_2)\Delta t$$

When $V_X = V_{cm}$ of ends transfer when $V_{cm} - V_{C_1} = V_{cm}$ or $V_{C_1} = 0$ $$V_{cm} - \frac{Q_{C_{1n}}}{C} = V_X \Rightarrow \frac{Q_{C_{1n}}}{C} = 0$$

$$\Delta t = \frac{V_{in}C}{2(I_1+I_2)}$$

$$V_{X_{PI}} = V_X - \frac{Q_{C_{2n}}}{C}$$

@ sw pt $V_X = V_{cm}$ $$V_{cm} - \frac{Q_{C_{2n}}}{C} = V_{X_{PI}}$$

$$V_{cm} + \frac{V_{in}}{2} - V_{cm} + \frac{I_2}{C} * \frac{V_{in}C}{2(I_1+I_2)} = V_{X_{PI}}$$

$$V_{X_{PI}} = \frac{V_{in}}{2} + V_{in}\left(\frac{I_2}{I_1+I_2}\right)$$

$$= V_{in}\left[\frac{1}{2} + \frac{I_2}{(I_1+I_2)}\right]$$

$$= [V_{cm} + \Delta V]\left[\frac{1}{2} + \frac{I_2}{2(I_1+I_2)}\right]$$

$V_{in}$ chg L
0.5
out
0.5bn
sm
$I_{1i}$-4
$I_2 = -4I_1$
$\frac{1}{2} + \frac{1}{2} = I_2$
$I_2 - \frac{1}{4}I_2$
$\frac{1}{2} + \frac{1}{2} * \frac{4}{3} = 1.1667$
$I_1 = -I_2 \infty$
$I_1 = I_2 = V_{X_{PI}}$
$I_1 = -\frac{1}{2}I_2$
=
$\frac{1}{2} + I_1 = \frac{3}{2}$
$V_{X_{PI}} = 1.5$

FIG. 17B

US 9,692,376 B2

CONTROLLED SWITCHED CAPACITOR COEFFICIENTS

CROSS-REFERENCE TO RELATED APPLICATION

This application claims priority of U.S. Provisional Patent Application Ser. No. 61/787,717 filed Mar. 15, 2013, which is incorporated herein by reference.

FIELD OF THE INVENTION

The present invention in general relates to switched capacitor circuits and in particular to a new method for switched capacitor charge control which allows for nodal control of charge transfer based switched capacitor circuits.

BACKGROUND OF THE INVENTION

Switched capacitor circuits, including configurations such as switched capacitor gain cells, integrators, doublers, and filters have long been recognized as one of the best ways to implement high accuracy analog circuits without the silicon die area and inaccuracies that can result from relying on on-chip passive components such as resistors. Switched capacitor circuits operate by controlling charge transfer between capacitors. Generally, charge is transferred between scaled capacitors with semiconductor switches that are switched at a frequency that effectively controls the rate of charge transfer, or current, in place of less accurate and much larger resistors that would otherwise be used.

FIG. 1 is a schematic of a conventional switched capacitor inverting gain circuit 10. Operation of the switched capacitor inverting gain circuit 10 is as follows: i) With switch 1 and switch 3 closed capacitor C1 is charged to the input voltage Vin; ii) switch 1 and switch 3 open, and switch 2 and switch 4 close; iii) In order to maintain the same voltage at the inverting terminal (−) as the non-inverting terminal (+) of the operational amplifier (opamp) 12, the opamp 12 supplies a current I to produce a charge equal and opposite to the previously stored charge on C1 (Vin*C1), where the current I has to flow through C2, which then charges C2 to a voltage of −(C2/C1)*Vin, and producing that voltage on the output (Vout) since the inverting terminal is held by the opamp 12 at ground.

FIG. 2 shows an alternate implementation of a conventional switched capacitor circuit 20. In FIG. 2, the opamp 12 of FIG. 1 is replaced by a current source 22 and a comparator 24. Activation of the switch 26 to voltage vp simply ensures that voltage vx is pulled below the reference voltage of the comparator during each cycle (ie., vp must be less than the reference). The operation is similar to the previous example: i) switch 1 and switch 3 close charging C1 to Vin; ii) switch 1 and switch 3 open and switch 2 and switch 4 close; iii) with switch 2 and switch 4 closed, switch 26 turns on followed by the current source 22, then switch 26 turns off. In this case the current source 22 will supply a current the same way that the opamp 12 of FIG. 1 did. Except, in this case the comparator 24 detects that voltage vx has reached ground, and disables the current source 22 once voltage vx reaches ground. Thus at the end of the charging period, the nodes are at the same potential as they were in the opamp case of FIG. 1, but the complexity of the opamp, including its loop response, offset, current demand and other non-idealities are replaced with a simple open source comparator 24 and current source 22 combination. The node vx will not reach ground until the charge previously stored on C1 (Vin*C1) is cancelled by exactly the same negative charge. The current which creates this charge must flow through C2 to reach C1 and therefore C2 will charge up to −(C2/C1)*Vin.

As shown in FIG. 2, the capacitor ratio (C1/C2) controls the voltage gain, and it is common to scale capacitors so as to control voltage according to the ratio of charge transfer (Q) in various switched capacitor circuits as Q=CV (if capacitance C changes so will voltage V for a given charge Q). For example, in FIG. 3 the opamp and comparator/current source based switched capacitor circuits use unit capacitors which may be switched into and out of the circuit to control the voltage gain as described above. This type of circuit is commonly seen in data converters, filters, programmable gain circuits and other critical precision analog applications.

However, the reliance upon unit capacitors for matching or programmability requires careful attention to the capacitor layout and also requires a lot of silicon area. For example, dummy capacitors, routing, matching techniques, and other measures are required to combat parasitics and the problems grow as the number of unit capacitors grows limiting the dynamic range of programmability. Unit capacitor matching often requires complex layout analysis and parasitic extract, and often re-spins of silicon. Furthermore, as additional switches and wires are utilized parasitic capacitances change causing errors in the circuit such as charge injection mis-match. In the opamp circuit of FIG. 1 it is not possible to scale the currents to the two capacitors (C1, C2). Also, as the input voltage must be fully loaded across C1, it is not possible to control the charge on C1 without complex voltage to current converters, which would degrade the accuracy of the switched capacitor circuits and make them undesirable for use.

It would therefore be desirable to produce a switched capacitor circuit which may be dynamically scaled without having to rely on unit passives, such as unit capacitors, and the complexities of switching these capacitors into and out of circuit. It would be further desirable if the current provided, and thus the charge transferred could be controlled at a nodal level, such that selected capacitors within a switched capacitor circuit may see scaled currents, and the current rather than the capacitors could be scaled. As relative current accuracy is much easier to achieve using current mirrors than laying out switched capacitors arrays is, the result would therefore be more accurate in addition to simplifying the solution and saving silicon area.

SUMMARY OF THE INVENTION

A switched capacitor circuit including two or more capacitors arranged in a switched capacitor circuit configuration with a comparator comparing a node whose potential varies with the charging of the two or more of the switched capacitors. The switched capacitor circuit also has two or more current sources coupled to the capacitors and to the comparator, where the current from one current source charges at least two of the capacitors in series during the charge portion of the cycle, and the other current source charges at least one of but at least one fewer of the capacitor(s) during the charge portion of the cycle, and where the current sources are enabled at the beginning of the charge portion of the cycle, but where the comparator disables the current sources once the node reaches a reference potential.

In embodiments the switched capacitor circuit can be used as a gain circuit by discharging a capacitor each cycle. Alternatively, the switched capacitor circuit acts as an integrator created by discharging a capacitor only once and then allowing it to charge during additional cycles. Additional applications of the switched capacitor circuit include, but are not limited to, a doubler, a filter, and a data converter A switched capacitor scaling circuit is also provided with two or more current sources scaled relative to the other, one current source charging a series connection of capacitors, and the other current source charging at least one fewer but at least one of the capacitors as the series connected current source, where the current sources modify the sum of currents into a switched capacitor summing node until a common mode potential is reached, and where the series capacitors accumulate different but proportional charge according to the ratio of the current source currents. In embodiments of the switched capacitor scaling circuit the current sources are derived from the same bias source, and the current source magnitudes are programmable.

BRIEF DESCRIPTION OF THE DRAWINGS

FIG. 13 shows a scaling table used during the synthesis of a switched capacitor filter from the relative values of the inductor, capacitor and resistor components from a ladder filter;

FIG. 17A-17B shows a derivation of the control function based on a charge balance for the circuit in FIG. 4, except the sign of I2 is opposite in the derivation;

DESCRIPTION OF THE INVENTION

The present invention has utility as a new method for switched capacitor charge control which allows for nodal control of charge transfer based switched capacitor circuits. Embodiments of the inventive method may be used to reduce reliance on passive component programmable arrays to produce programmable switched capacitor circuit coefficients. Embodiments of the invention provide a switched capacitor circuit which may be dynamically scaled without having to rely on unit passives, such as unit capacitors, and the complexities of switching these capacitors into and out of circuit. In embodiments of the inventive circuit, the current provided, and thus the charge transferred may be controlled at a nodal level, such that selected capacitors within a switched capacitor circuit may see scaled currents, and the current rather than the capacitors are scaled. As relative current accuracy is much easier to achieve by using current mirrors rather than laying out switched capacitor arrays, the result is therefore more accurate in addition to simplifying the solution and saving silicon area.

Figure 1:
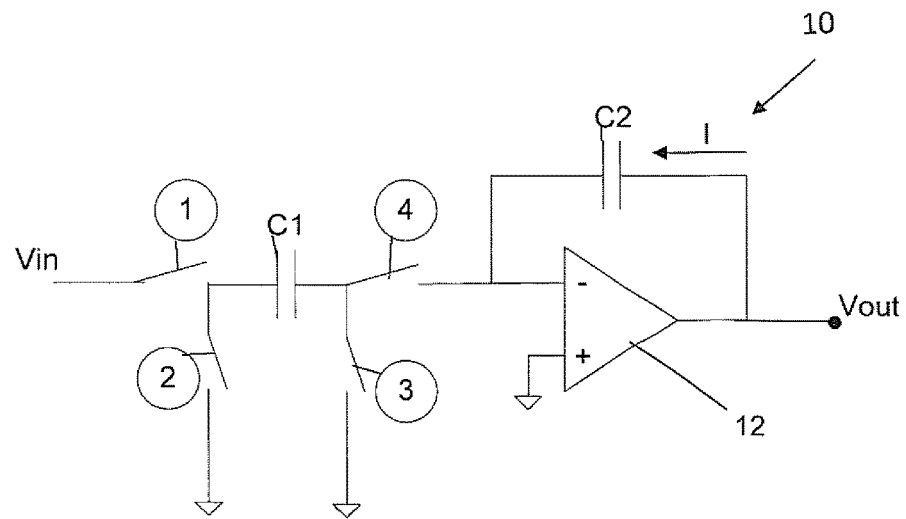
FIG. 1 is a schematic of a standard operational amplifier (opamp) based switched capacitor integrator, or if C2 is shorted each cycle a gain circuit is realized.
Figure 2:
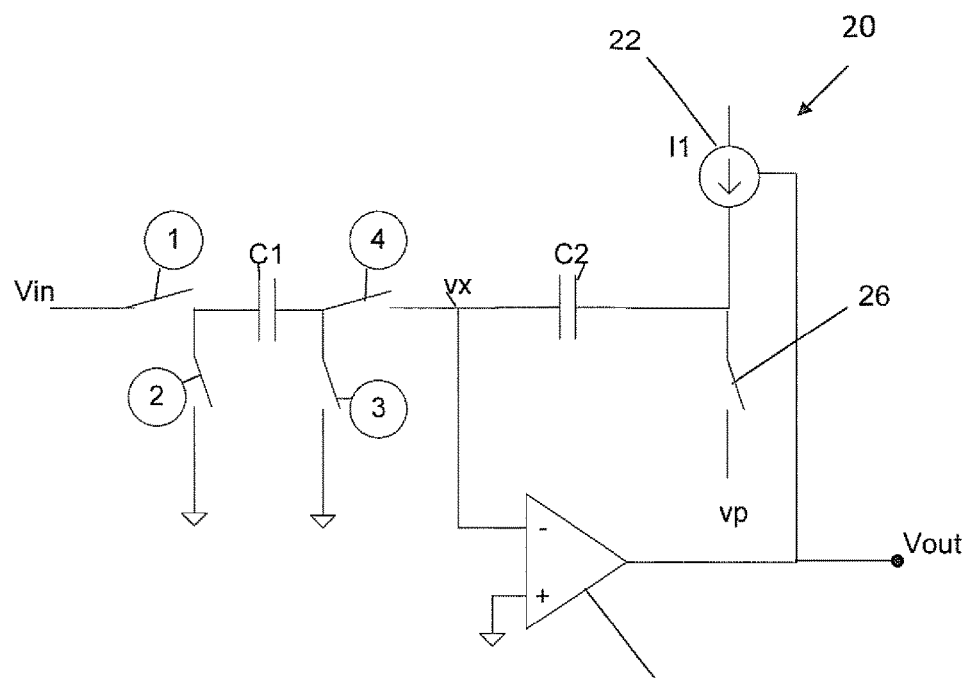
FIG. 2 is a schematic based on the switched capacitor integrator or gain circuit of FIG. 1, where the opamp is replaced by a current source, a comparator, and a switch pulling the comparison node to a potential lower than the comparator reference voltage.
Figure 4:
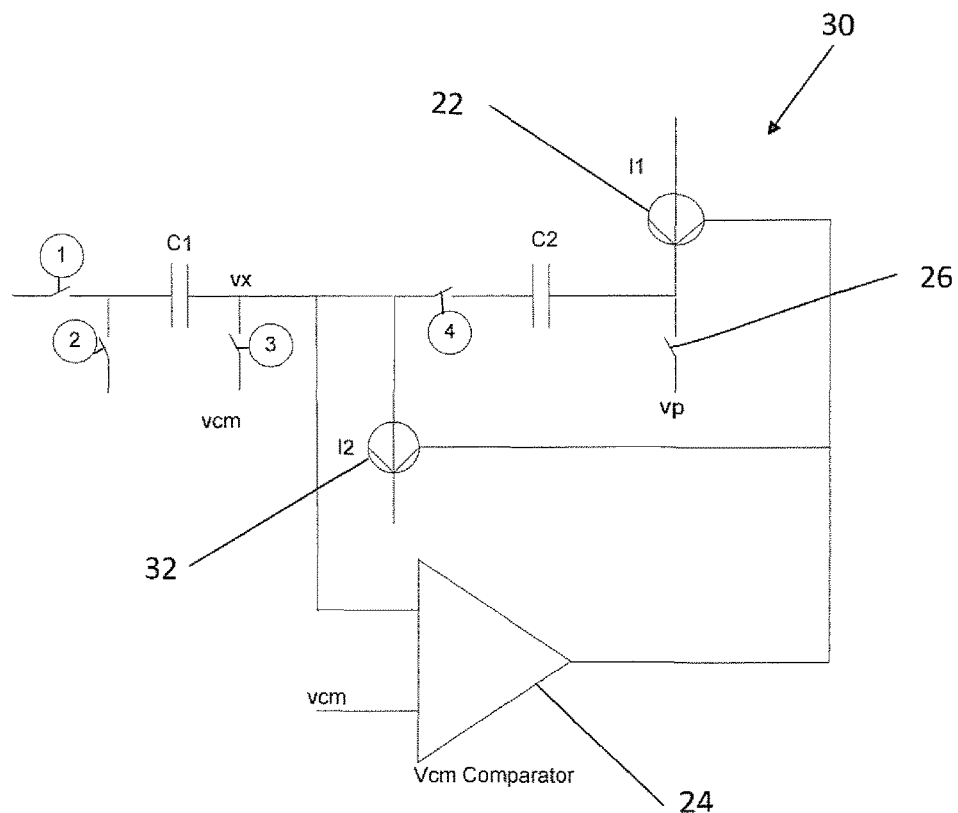
FIG. 4 is a schematic where an additional current source sums a proportional but differing current into the comparator reference node so as to change the charge accumulating on the two capacitors to program the gain, or alternatively, the second current source (I2) may be related by a duty cycle to the first current source (I1), such that I2 turns off before I1 so as to create different charges on each of the capacitors and program a gain with a duty cycled current source I2 according to embodiments of the invention.

Referring now to the figures, FIG. 4 in an inventive switched capacitor circuit 30 that is based on the conventional switched capacitor circuit 20 of FIG. 2 with the addition of a second current source (I2) for an extra degree of freedom. In circuit 30 the second current source I2 is proportional to current source I1, and current source I2 is used to discharge the node vx. It is well known to those skilled in the art that highly accurate current mirrors and bias circuits can be created, thus it is not difficult to create a discharge current I2 which is related by a factor (D) to the current I1 such that the I2 current is D*I and the charge current is i, or to make I1 and I2 continuous but scaled relative to each another. The operation of circuit 30 is as follows: i) C1 charges to Vin after switch 1 and switch 3 close ii) switch 1 and switch 3 open and switch 2 and switch 4 close. iii) switch 26 is turned on, then current source 22 (I1), then switch 26 is turned off and current source 32 (I2) is turned on with the I2 current being D*I1 (where D is a duty cycle or a scaling coefficient between 0 and 1). For example if D were 0.8 then I2 would be sinking 0.8I and I1 would be supplying I. C1 would see 0.2I and therefore it would take five times (5×) as long to charge to the point that voltage vx would rise to voltage vcm and turn off the current sources as it would with a duty cycle of 0 (no sinking current source at vx). During all of this time capacitor C2 continues to see the full charging current I. It will therefore receive five times (5×) the charge and produce a voltage across C2 five times (5×) as large as it would with a duty cycle of 0 (no sinking current source at vx). For those skilled in the art, this added degree of freedom where matched but scaled current sources are used to modify the charge balance into switched capacitors at charge transfer nodes, may be used to create programmable switched capacitor circuits including gain, doubler, integrator, filter and other circuits.

Figure 5:
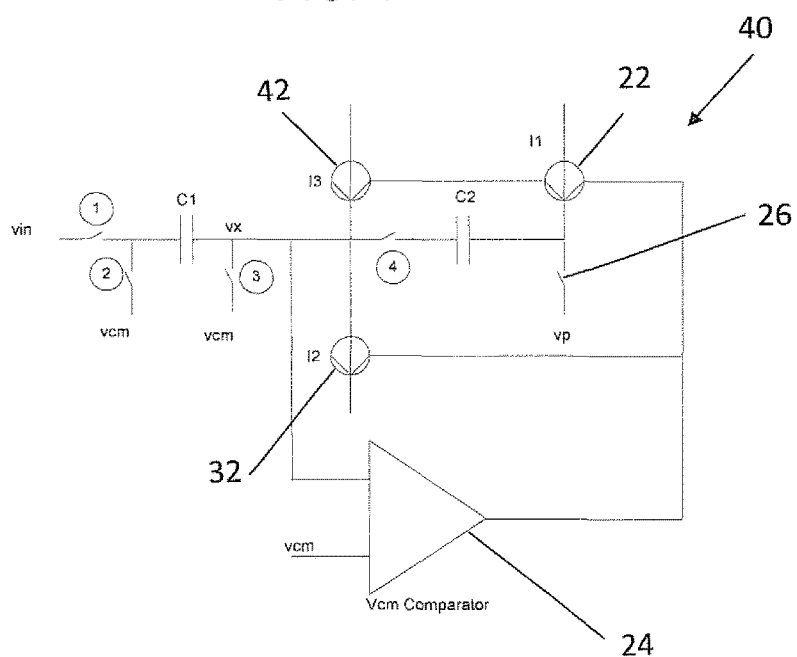
FIG. 5 illustrates a schematic showing how current source I2 of FIG. 4 may be positive or negative according to embodiments of the invention.
Figure 6:
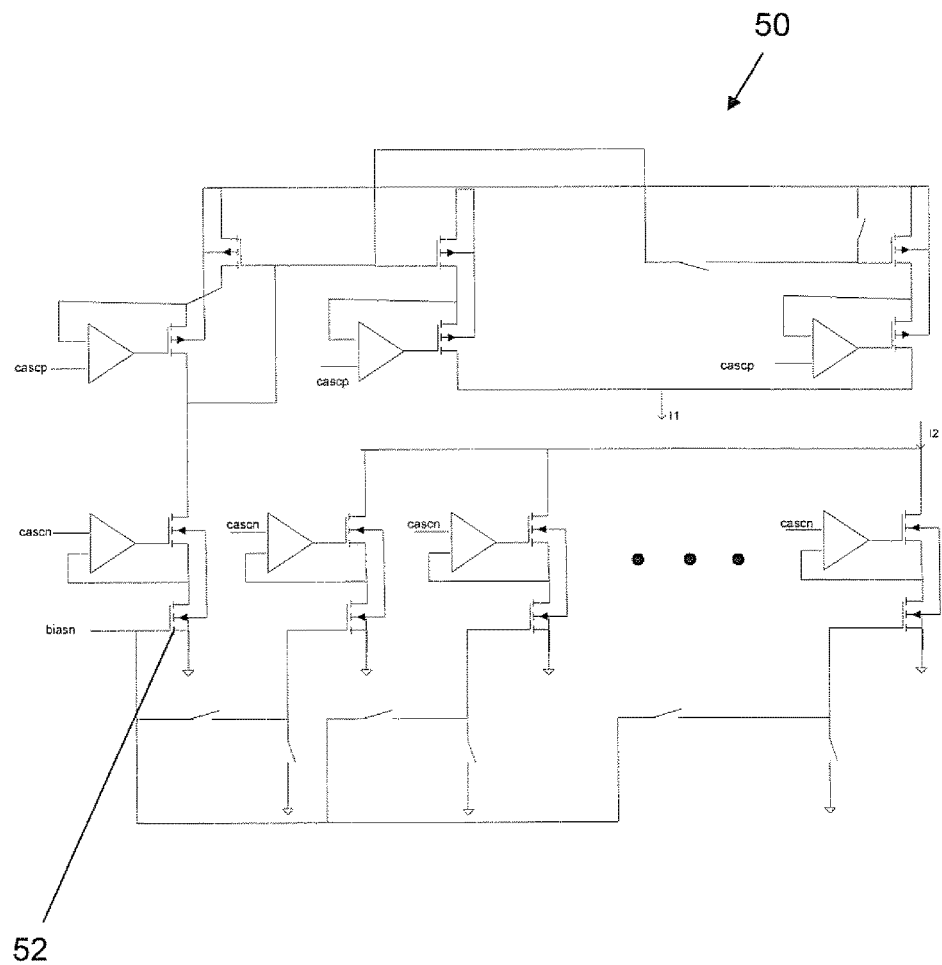
FIG. 6 is a schematic of a proportional but scaled programmable current sources according to an embodiment of the invention.

FIG. 5 introduces a circuit 40 that further extends the concept with a third current source 42 (I3), and by allowing either charge or discharge of the node described above such that the voltage change across C2 may be either scaled to be larger or smaller than across C1 during each cycle (if C1 and C2 are equal). The current sources 22, 32, and 42 (I1, I2 and I3) may be made programmable relative to one another, yet accurate against the same input bias, by using a programmable current source fanout such as that shown in FIG. 6. In this case a bias current is derived from biasn and provided as a potential to the second side of a mirror formed by the common source transistor 52 on the bottom left of FIG. 6 whose gate is connected to the node held at bias n (biasn). The bias potential, biasn, may be derived from as a wide swing bias or utilize one of the many schemes known by those skilled in the art that are available to make the current independent of process parameters and temperature, or to vary the bias against such parameters in a desirable way. The current source fanout circuit 50 shown in FIG. 6 utilizes groups of parallel current mirror outputs which may be identically sized, or sized digitally or otherwise sized relative to one another. The n-channel and p-channel parallel arrays are created from biasn such that they will be accurate relative to one another, but different in scaled proportion. Supercascodes are also shown and will be known to those skilled in the art as a means by which maximizes output impedance and thus minimize lambda errors due to finite output voltages. The parallel current mirrors are either turned on or off according to the switches, which either connect the current sources (by connecting the bias gate) to their respective voltage biases or to their respective rails to turn them off (and separate them from the bias voltage if they are turned off). Alternate embodiments which utilize a series switch to enable or disable the current sources or re-use the cascode as a series switch to turn on and off the current sources will be known to those skilled in the art. Regardless of the scheme used, these parallel current sources are summed to form a programmable current sources I1, I2, I3 (as shown in FIG. 5) and could be extended using the same technique to produce any number of programmable current sources which are accurately scaled to one another according but with a programmable scale factor. Alternatively, the current sources could have a limited duration of operation each cycle or operate according to a duty cycle so as to control the net charge transferred. Examples of circuits which benefit from this technique will be described next.

Figure 3:
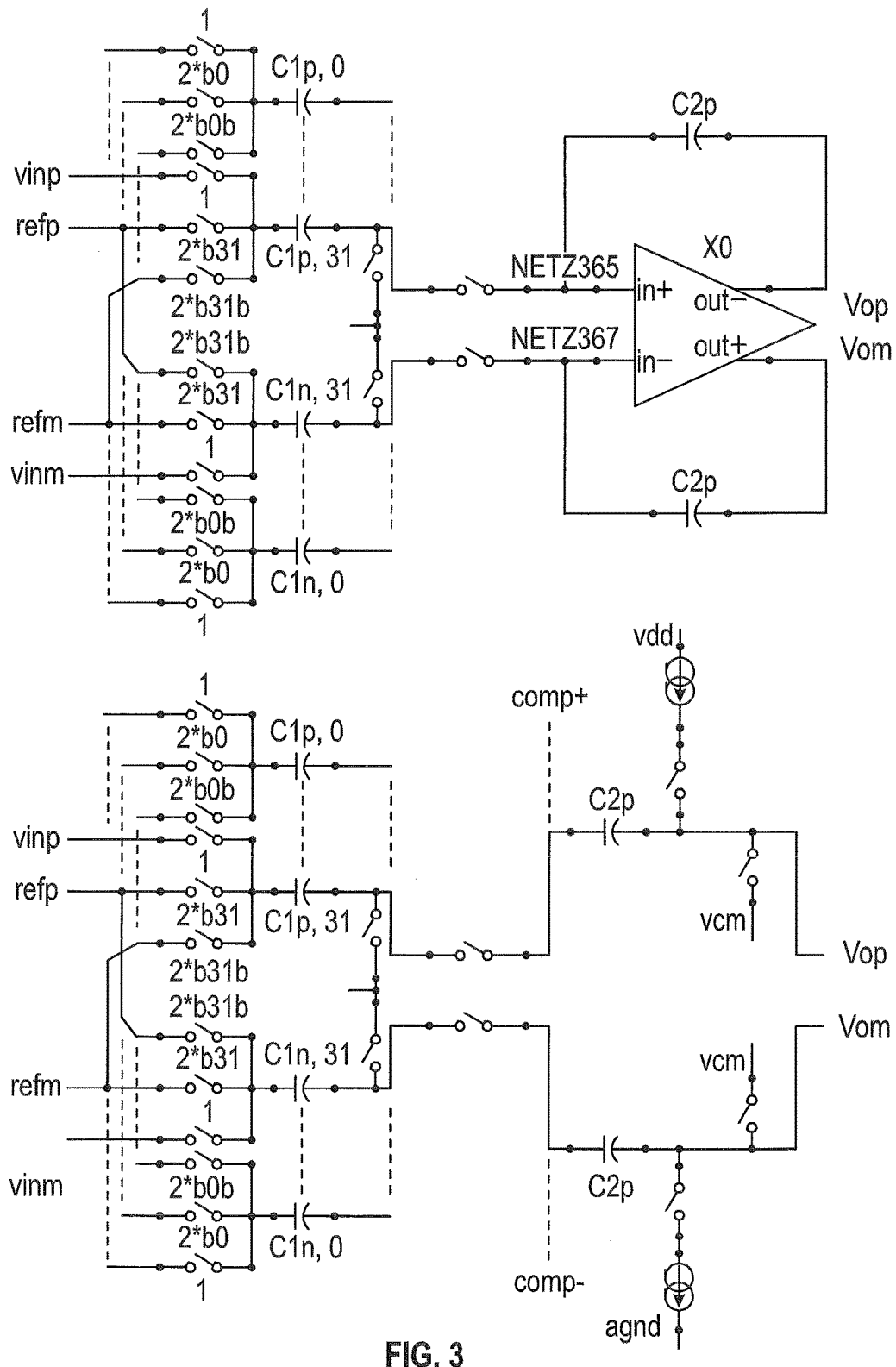
FIG. 3 is a schematic of a passive capacitor array where unit capacitors are switched into the integrator or gain circuits of FIG. 1 and FIG. 2 according to a digital control word, so as to program the gain of the switched capacitor circuits in conformance with the digital control word.
Figure 7:
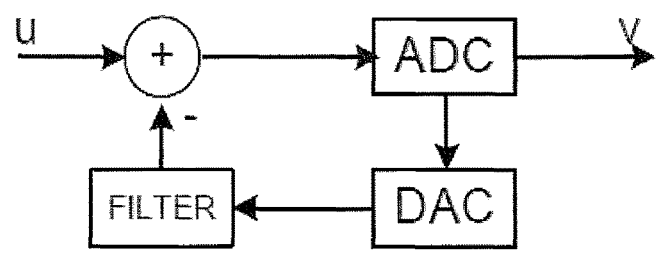
FIG. 7 is a block diagram of a delta sigma data converter that uses digital feedback according to an embodiment of the invention.

FIG. 7 shows a standard delta sigma loop circuit 60 utilized to provide digital feedback in delta sigma converters for a variety of applications. In any delta sigma loop it is necessary to translate a digital word to an analog voltage so that it might be subtracted in an analog fashion to determine the error (the delta of the delta sigma). Embodiments of the invention replace the coefficient programmable integrator based digital to analog converter (DAC) in FIG. 3 as part of the feedback mechanism for an analog to digital converter (ADC), and can also be used in a DAC configuration only. One way this is accomplished is using a switched capacitor implementation as shown in FIG. 3 where the digital word is utilized to connect an appropriate number of the capacitors in the unit capacitor array to create a coefficient (gain) conforming to the digital word. For example, if the digital word is 5 bits wide, then thirty two capacitors would be required to create the proper coefficient value. With embodiments of the invention it is possible to eliminate thirty one of these capacitors and instead utilize the disclosed new technique to create the desired charge ratio.

Figure 8:
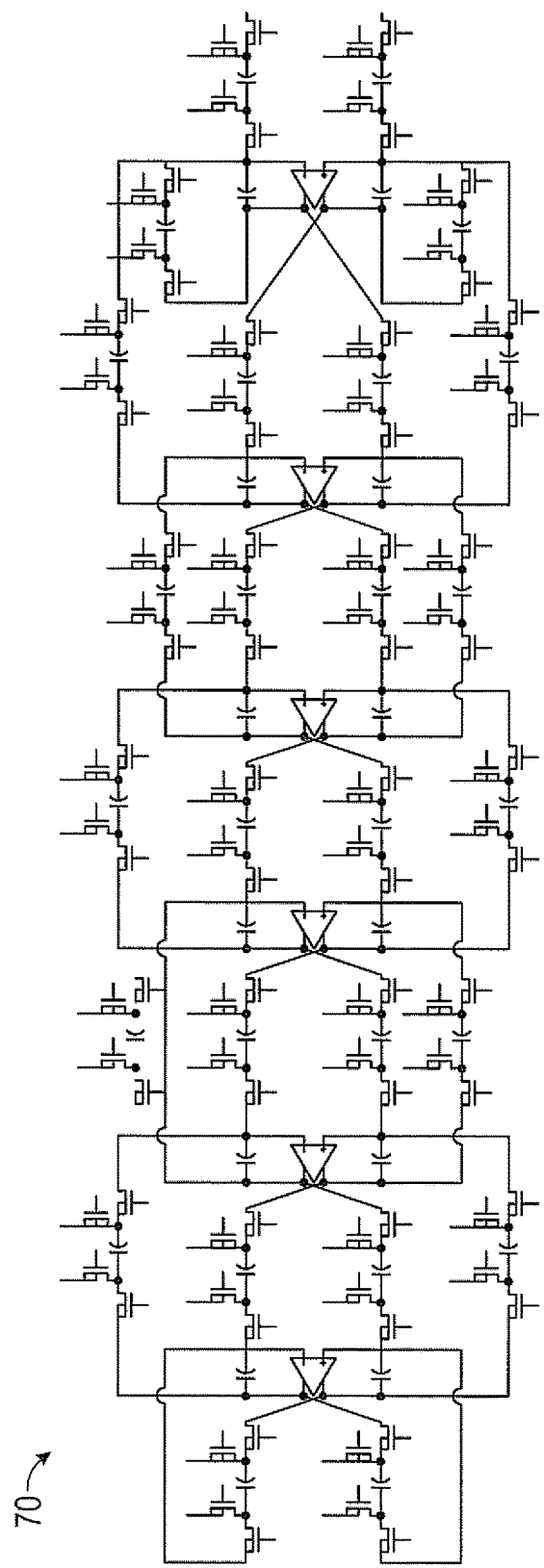
FIG. 8 is a schematic of a 6th order switched capacitor filter to illustrate an implementation that is compatible with a conventional opamp based switch capacitor circuits or comparator based switched capacitor circuit including embodiments of the invention.
Figure 9:
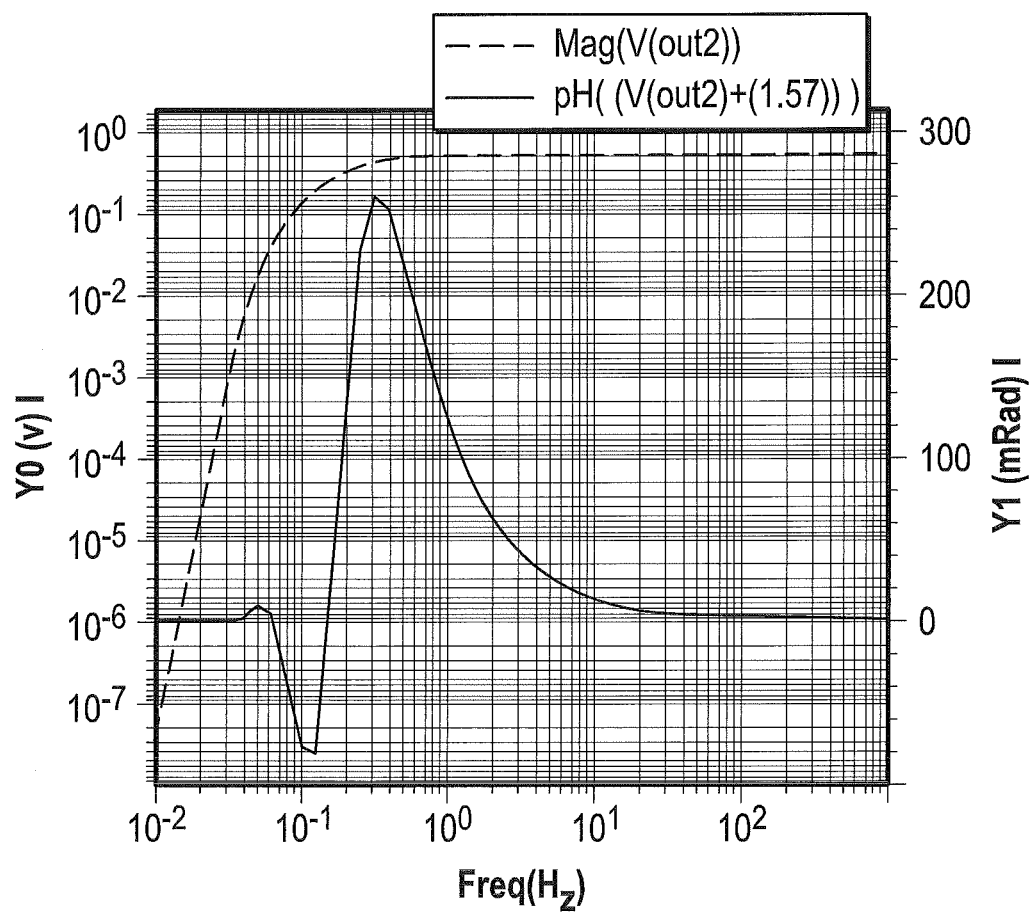
FIG. 9 is a bode plot of a low corner frequency high pass 8th order Bessel function response of a type of filter that can only be implemented on an IC using a switched capacitor filter due to its low corner frequency.
Figure 10:
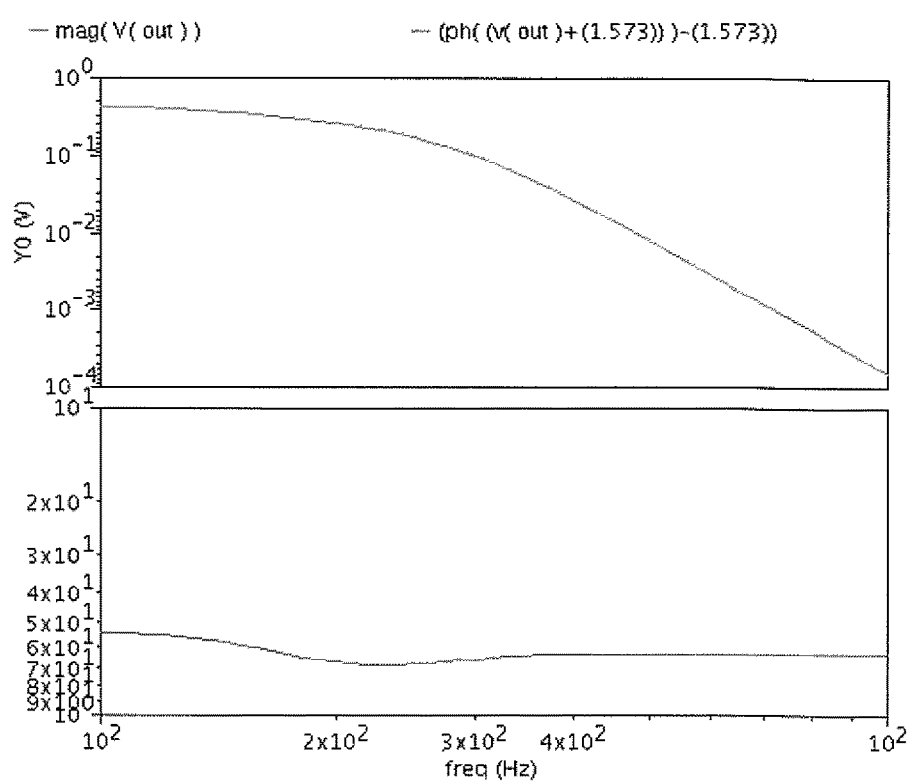
FIG. 10 is a bode plot of a 6th order low pass Bessel filter response.
Figure 11:
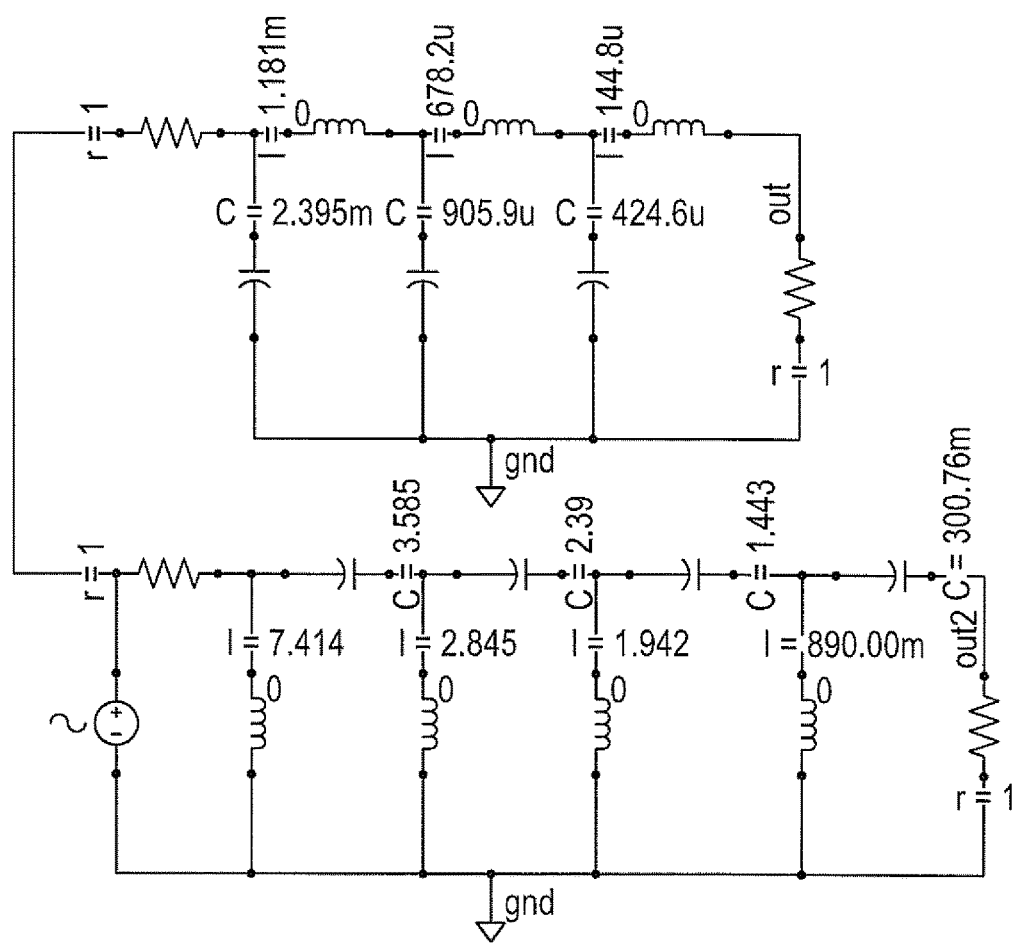
FIG. 11 is a schematic of a ladder filter.

FIG. 8 illustrates another common application for switch capacitor circuits which would benefit from embodiments of the invention. FIG. 8 is a switched capacitor filter 70. Such filters are especially dependent upon switched capacitor techniques especially when they have responses such as those shown in FIG. 9 and FIG. 10. FIG. 9 is a bode plot of a low corner frequency high pass 8th order Bessel function, and is the type of filter that can only be implemented on an IC using a switched capacitor filter due to its low corner frequency. Note that the filter also has constant group delay and that the radians curve is in milli-radians. FIG. 10 shows a bode plot of a 6th order low pass Bessel filter response that is representative as that which could be implemented using the circuitry in FIG. 8. The corner frequency for these filters is so low that no other technique besides a switched capacitor filter can reasonably be used on silicon. It is well known to those skilled in the art that ladder filter implementations can be synthesized into a switched capacitor filter using the information as shown in FIGS. 8, 9, 10, 11, 12, and 13. In FIG. 11 the ladder filters utilizing inductor and capacitor elements are derived either mathematically, from a coefficient table as shown in table I that are readily available in the industry, or with industry standard programs such as FilterX. A ladder filter is less sensitive to component variations than series biquads or other filters.

Figure 12:
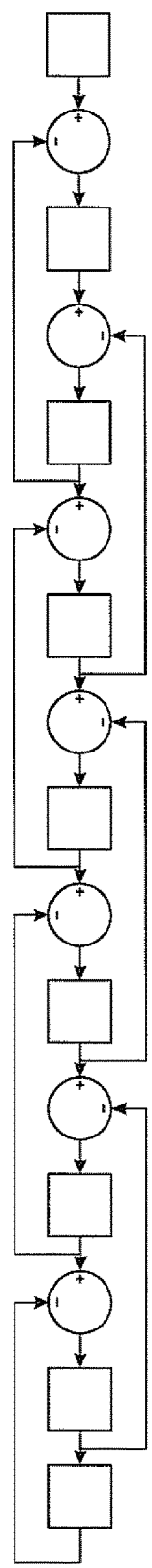
FIG. 12 shows the ladder filter flow diagram which is used to replace inductors or capacitors with delay (integrator) based functions.

The flow diagram of the filter as shown in FIG. 12 is then synthesized and the feedback paths turned into appropriate switched capacitor coefficients as shown in FIG. 13. FIG. 13 is a scaling table used during the synthesis of a switched capacitor filter from the relative values of the inductor, capacitor and resistor components from a ladder filter.

Although the ladder filter is relatively insensitive to component values the high order of the filters means that parasitic errors in the capacitor array will alter the transfer function of the filters undesirably. If a capacitor array is utilized to program the response, the relative values of the parasitics related to the connections of varying numbers of capacitors, their locations, thermal and process variations, and charge injection all come into play to reduce the accuracy of the filter response. If instead embodiments of the inventive method are utilized, it is much easier to control the accuracy of the current sources and it is relatively easy to do so over a far greater dynamic range than is possible with capacitor array due to its greater area and complexity of implementation. Additionally, on-line tuning over more discrete values can be implemented in a smaller area.

Figure 14A:
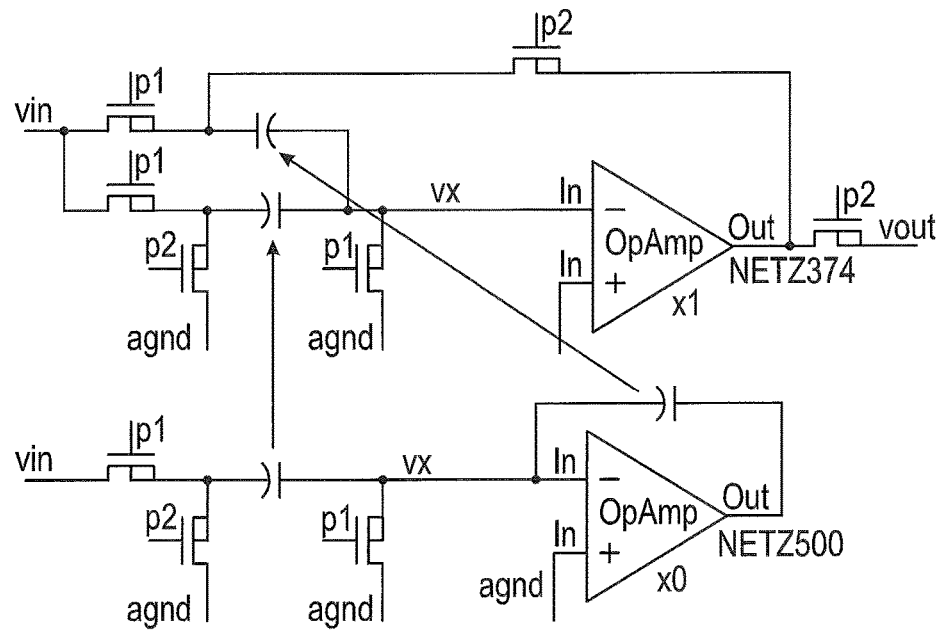
FIGS. 14A and 14B are a schematic of a doubler circuit, and the transition of the circuit from an opamp based doubler to a comparator based doubler, respectively.
Figure 14B:
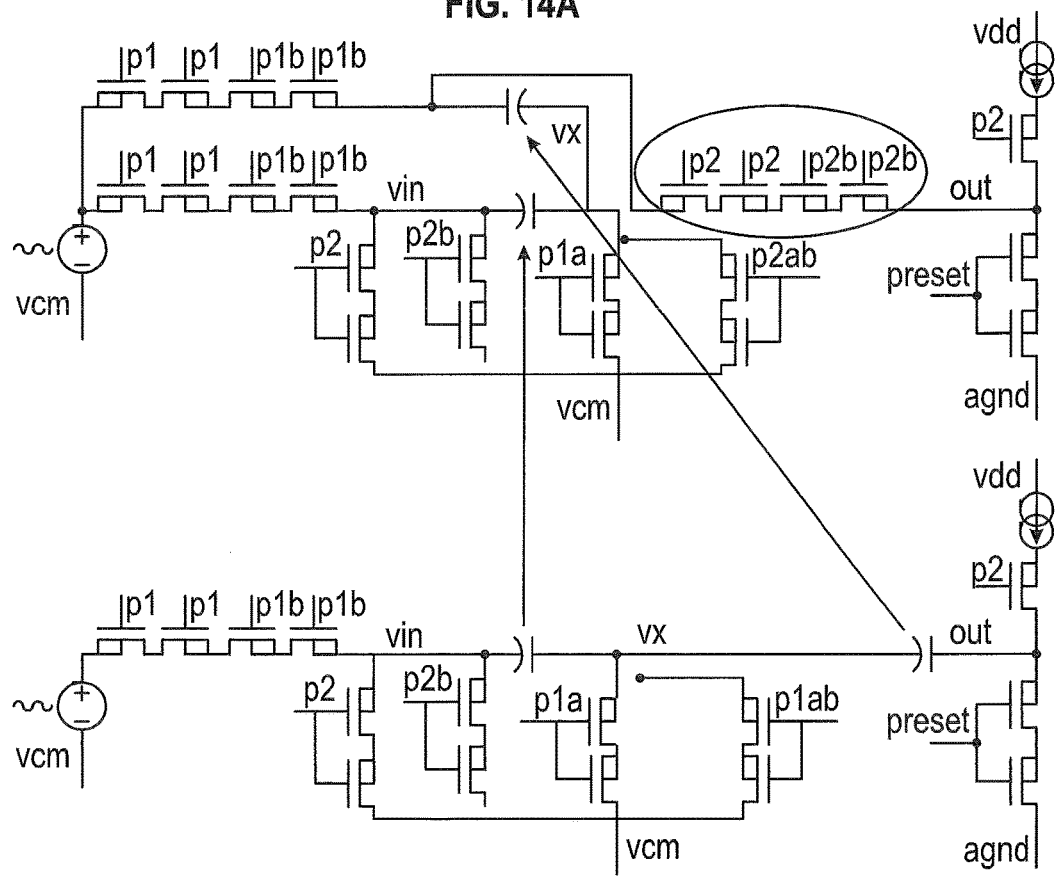

FIG. 14A shows a doubler circuit and the transition of the circuit from an opamp based doubler to a comparator based doubler as shown in FIG. 14B. The summing of currents at the output and the vx node (current source not shown), plus the vp reset, allow scaling of currents to the two capacitor during the charge portion of the cycle so that their gain could be programmed. The doubler configuration of FIG. 14A can be easily be turned into a variable gain stage utilizing the inventive method. Those skilled in the art will recognize that the circuits of FIGS. 4 and 5 may be used as an integrator if C2 is not reset each cycle, or as a gain cell if C2 is reset each cycle. An integrator or $z^{-1}$ delay (or $1-z^{-1}$) cell is the basis of all z-domain mathematics, and can therefore be utilized as the basis for all manner of z-domain data converters, filters or amplifiers and comparators.

Figure 15:
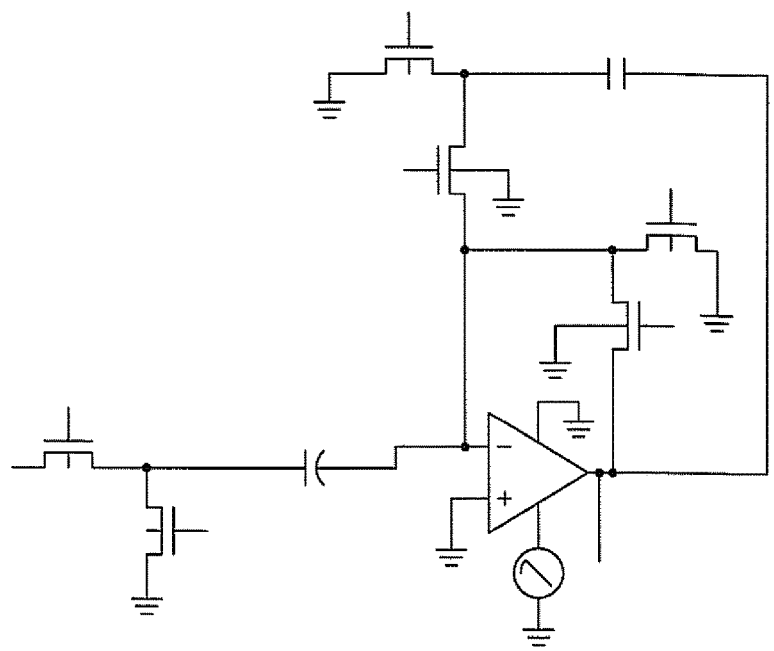
FIGS. 15 and 16 are schematic diagrams of opamp based parasitic insensitive switched capacitor topologies which load in opamp non-idealities such as an offset and remove them each cycle.
Figure 16:
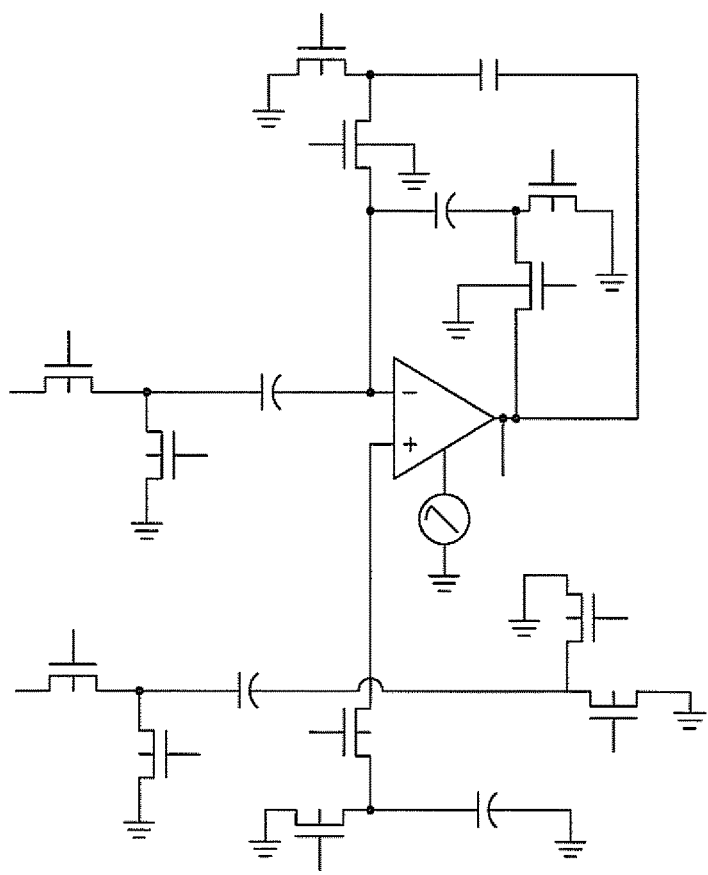

FIGS. 15 and 16 are schematic diagrams of opamp based parasitic insensitive switched capacitor topologies which load in opamp non-idealities such as offset and remove them each cycle. This type of circuit is not compatible with the comparator and current source based switched capacitor approach. FIGS. 15 and 16 are readily recognized by those skilled in the art as examples of non-differential and differential parasitic insensitive switched capacitor circuits, respectively, where the offset of the operational amplifier is effectively removed making the circuits more accurate than their continuous counterparts. As there is no operational amplifier in the comparator and current source techniques described, we therefore require a different method by which to achieve such accuracy.

Figure 17A:
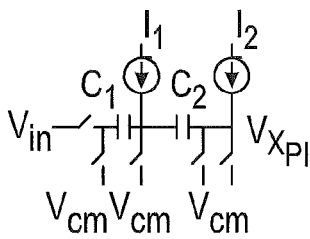

The control function related to the switched capacitor circuit depicted in FIG. 4, but with I1 and I2 reversed, is Vout=Vin*[½+½*I2/(I2−I1)], where the capacitors are of equal value. I1 can be positive or negative and therefore the output may be larger or smaller than the input. If a common mode voltage other than ground (gnd) is used (vp can remain gnd or any consistent value lower than the reference even with a different common mode), then the different charging rates on the two capacitors must be considered. Vp must also be considered. If Vin=Vcm+deltaV, where deltaV is our value of interest and Vcm is out common mode, then we have Vout=[Vcm+deltaV][0.5+0.5*I2/(I2−I1)]. The derivation of this equation is shown in FIG. 17, with the derivation of the control function based on a charge balance for the circuit in FIG. 4, except the sign of I1 is opposite in the derivation. Some notes verifying the transfer function with Cadence Ultrasim simulations are also present. Clearly there will be an additional charge component on the output proportional to Vcm. To remove this additional charge, a replica circuit is required on the negative terminal with Vcm as the input without delta V. In a differential structure this will produce a −Vcm*[0.5+0.5*I2/(I2−I1)] to subtract out the charge added on the positive terminal by the common mode voltage. Similarly a method must be used to remove the error due to Vp resulting from the difference in charge on C1 and C2 due to their scaled charge rates. One method would be to correct the output digitally. To determine the digital error correction required, each time the ratio of currents is changed, a 0V input could be input into the input capacitor and the resulting error on the output capacitor recorded. As the input capacitor has to be charged with a charge opposite that imparted by Vp, just like it does the charge imparted by Vin, if it is to reach the common mode, therefore the resulting output error would be the systematic error at a given current ratio. Where the current ratio is 1:1 this error does not occur since the Vp charge is reversed equally during the charge transfer phase.

Figure 18:
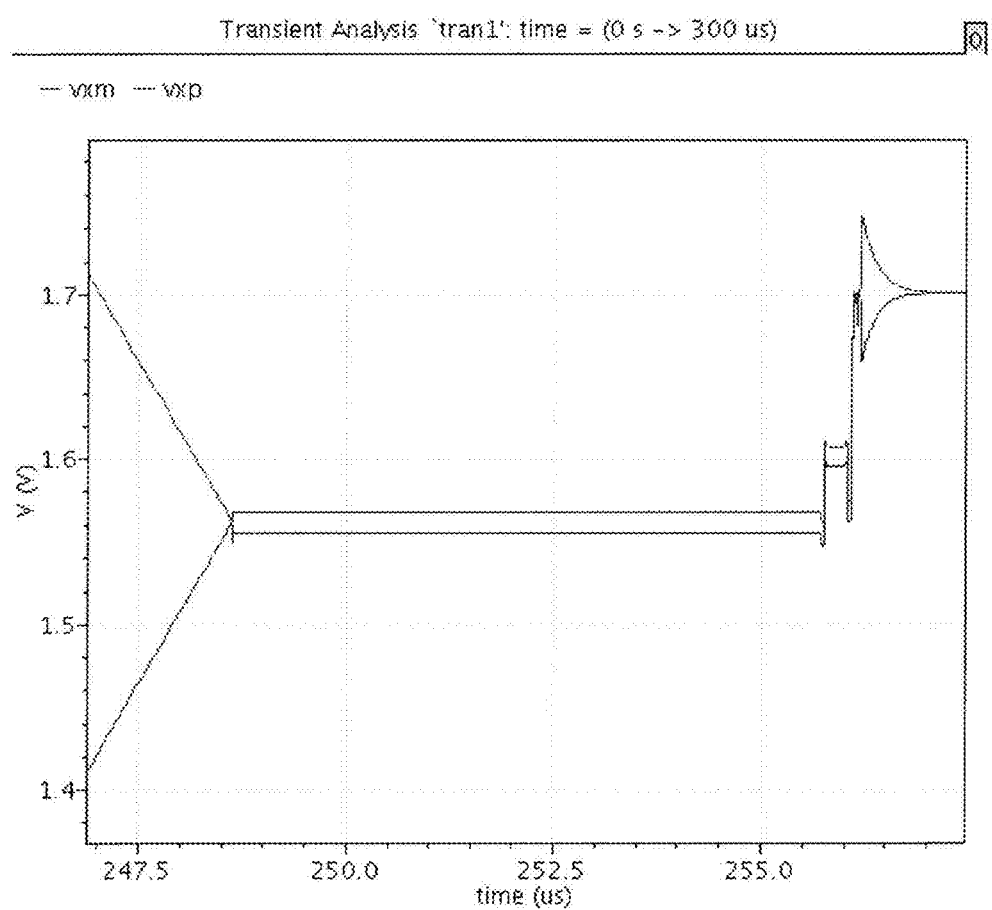
FIG. 18 graphical representation of the error caused by the finite propagation delay of the comparator between the reference node and the feedback node.
Figure 19:
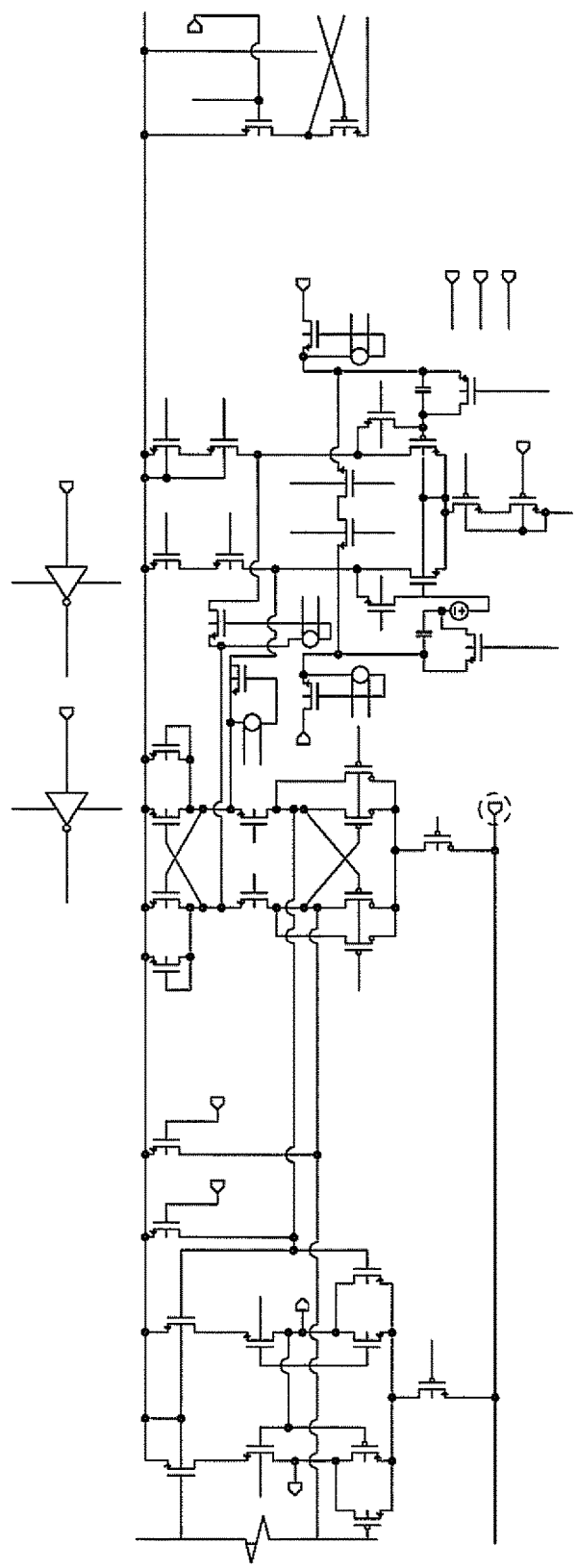
FIG. 19 is a schematic of a fast comparator topology.
Figure 20:
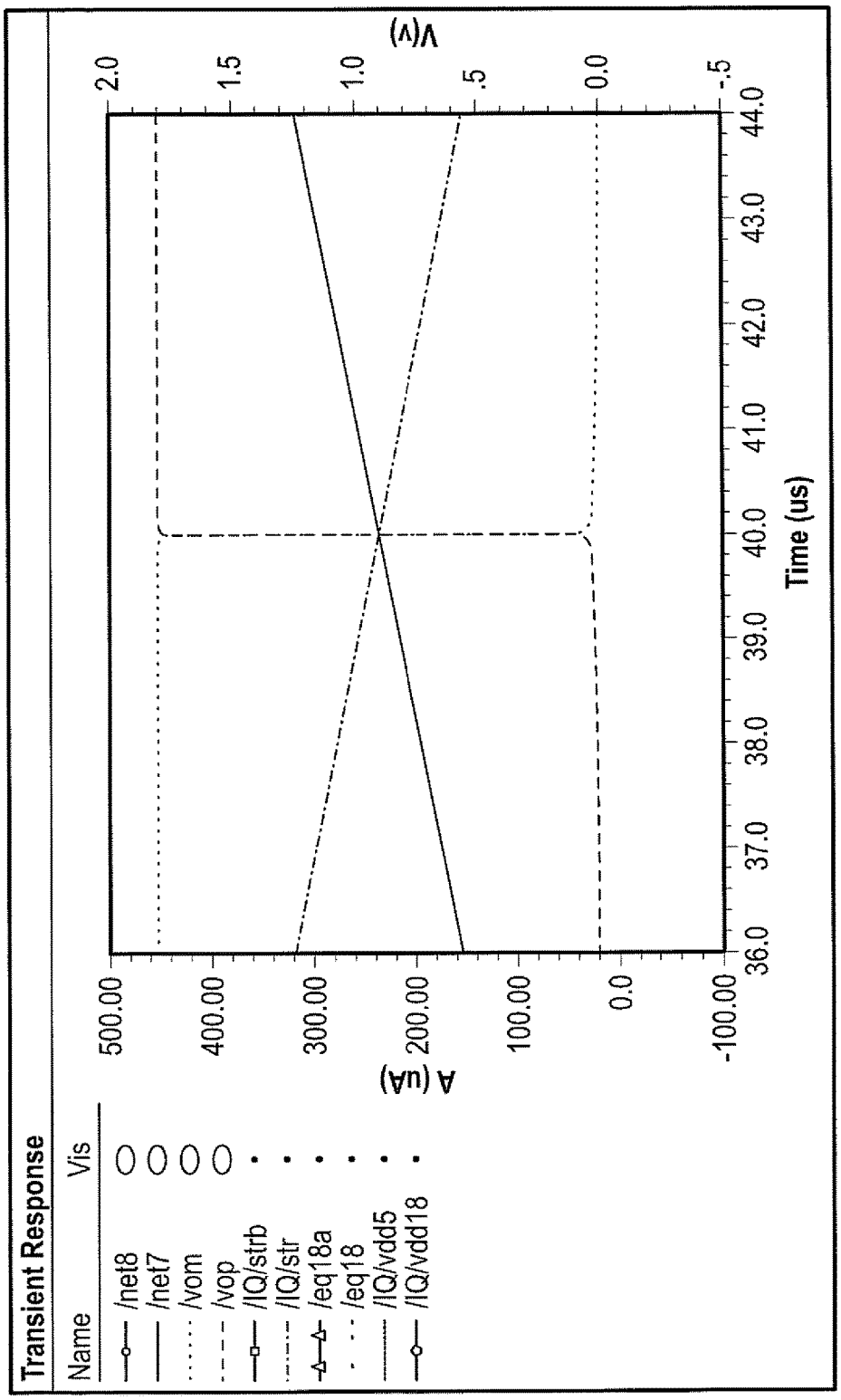
FIG. 20 is a simulation of the comparator operation transistor response.
Figure 21A:
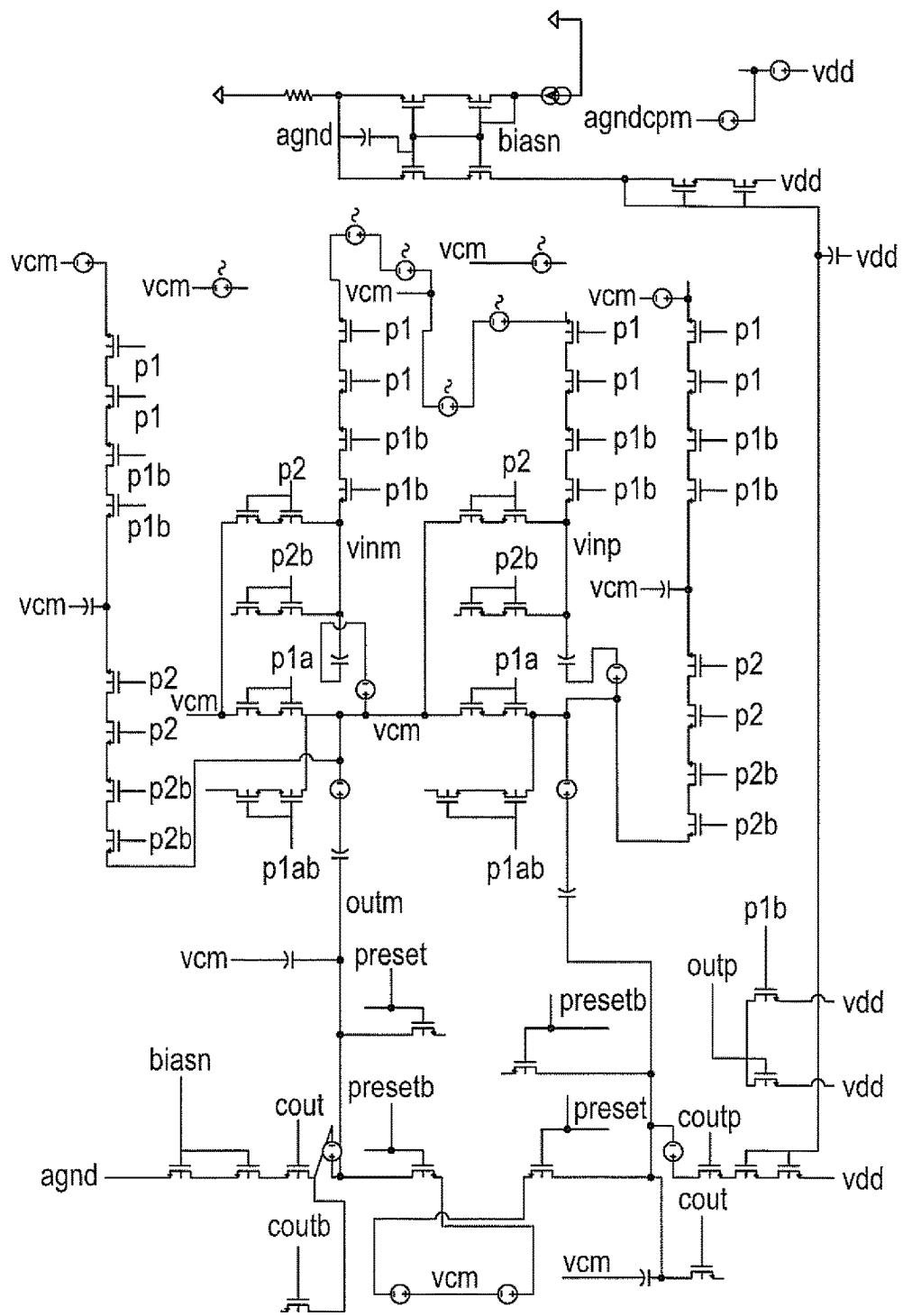
FIG. 21A-21B shows an actual implementation of a switched capacitor circuit including a comparator.
Figure 21B:
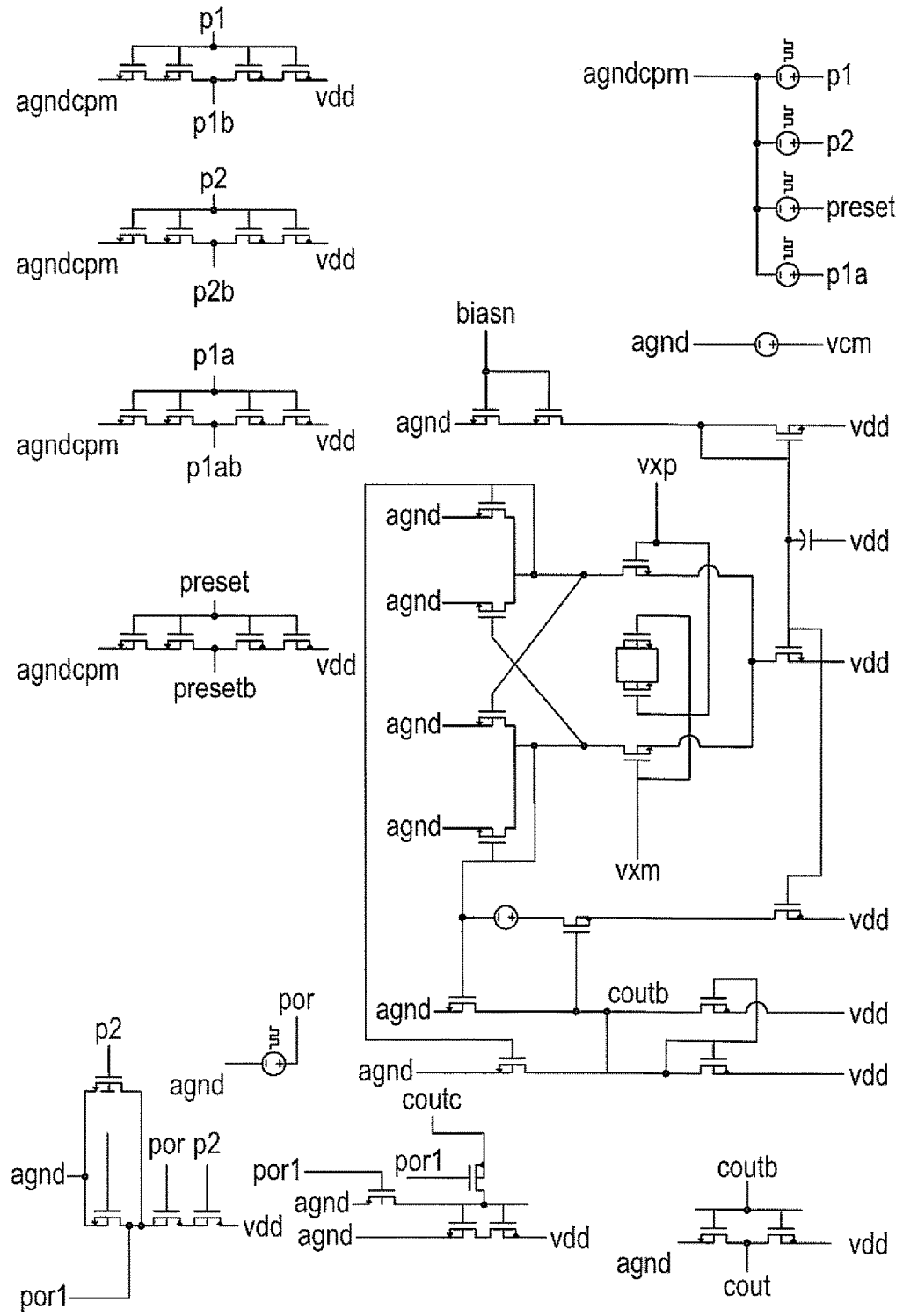

The dominant sources of error in the inventive methods introduced herein come from the finite propagation time and noise on the comparator (including noise modeled metastability) as illustrated in FIG. 18 where a small overshoot between the comparator reference and the charge node between capacitors results from propagation delay. This can be corrected for by several techniques. One technique is to utilize a fast comparator, such as the topology shown in FIG. 19 and whose response is shown in the simulation of FIG. 20 to minimize the propagation error. Additional switch cap input branches may be used to transfer a charge equal but opposite of the error onto the comparator control node (vx) as shown in FIG. 21, and this charge voltage may be adjusted by a nuller circuit in closed loop. There are a variety of techniques by which to implement a nuller circuit which are known to those skilled in the art.

Alternatively, two comparators may be used with one comparator with very low current and the other comparator which has high gain and is fast due in part to a higher bias current. The first comparator turns on just before the crossover event. This comparator can accommodate large current utilization as it is only on for a brief period each cycle and therefore over time represents a small average current. This technique may be used with or without the nuller previously described.

Figure 22:
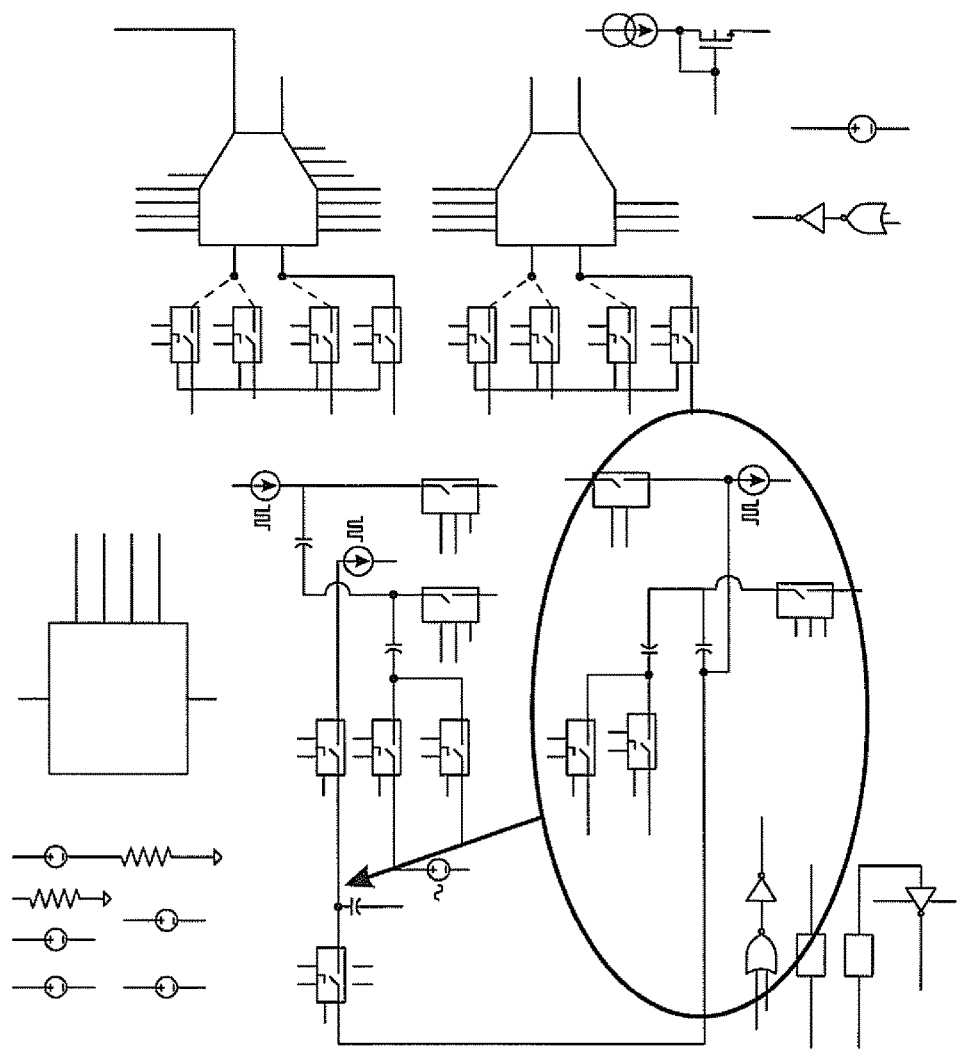
FIG. 22 is a schematic with a nulling circuit that is circled with an arrow showing the leg being summed into the primary switched capacitor circuit to remove finite propagation and other errors related to the comparator, also shown are the fast and slow comparator techniques multiplexed between the nulling circuit and the primary circuit.

The nulling technique can be implemented by adding an additional switched capacitor input leg (such as a leg similar to those illustrated in FIG. 3) summing into the comparison node where the input to that switched capacitor leg input is the common mode. If the same current sources are used as with the other input leg(s), and the same comparator is used but both the loading and charging portions occur during the initial portion of the cycle, then a charge equal to the error caused by the finite propagation and other non-idealities of the comparator will be loaded onto the capacitor. If this charge is then subtracted from the comparison node before initiation of the charge transfer period, then the error due to the comparator will be removed in a process analogous but different to parasitic error removal schemes of FIG. 15 and FIG. 16. The technique is shown in more detail in FIG. 22 where the circle surrounds the device fed the common mode voltage which sums a charge error opposite to that of the main switched capacitor channel during the first part of the cycle and puts it onto a storage capacitor which is then summed into the comparator control node during the second portion of the cycle. Note that during the first part of the cycle for the overall switched capacitor circuit, there is a load and a charge cycle for the nulling portion of the circuit. During this period the comparators are multiplexed as shown to control only the nulling circuit, while during the main switched capacitor charging phase the comparators are multiplexed to the primary switched capacitor circuit. Also shown in FIG. 22 are the slow and fast comparators with both comparators multiplexed as described, but with a slow comparator turning on a higher current fast comparator. This topology will yield the optimal result as the charge error will be minimized but still captured.

Alternatively, if a time based duty cycle is used to program the ratio of charge into the input capacitor versus the output capacitor, then corrections factors for the duty cycle may be determined periodically by loading a known quantity and adjusting the duty cycle until the output is correct. This will correct for errors due to current mismatches, charge injection, comparator propagation and metastability, switch bootstrapping, offsets or Vp (reset voltage). It may be desirable to adjust the duty cycles of the capacitor on the legs on both sides of the comparator in a differential structure rather than just have the same single duty cycle on both legs.

In an embodiment, errors related to non-idealities of the two or more current sources and the comparator are removed with a nuller circuit, and where a summing node utilizes one or more additional switched capacitor branches, and the nuller circuit offset charge is subtracted from the summing node.

Figure 23:
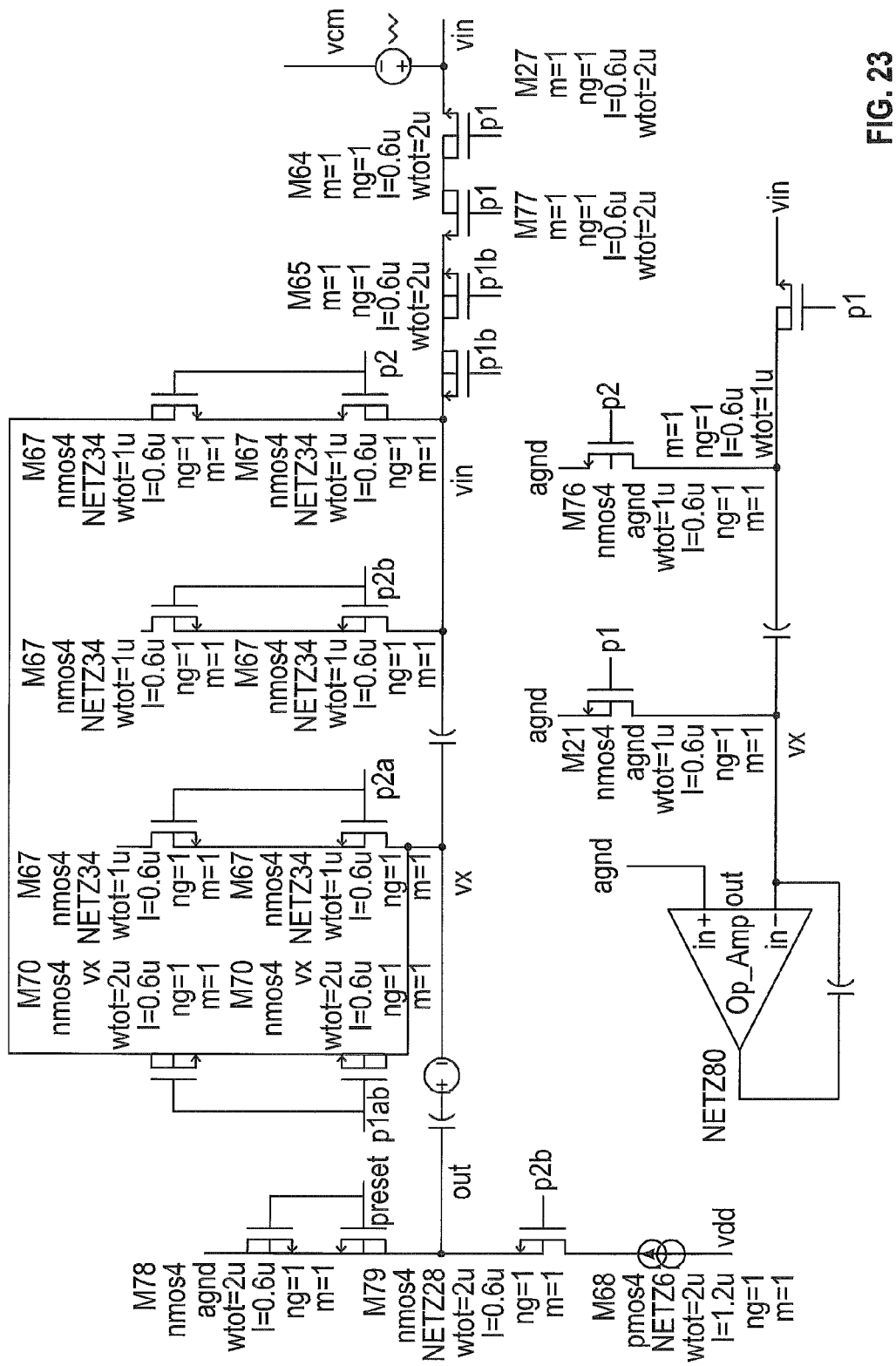
FIG. 23 is a schematic of a switchcap comparator based integrator implementation and an opamp based implementation for comparison with transistor switches.

FIG. 23 is a schematic of a switchcap comparator based integrator implementation and an opamp based implementation for comparison with transistor switches. As shown the circuit is an integrator. Discharging the output capacitor each cycle creates a gain circuit.

It will be recognized by those skilled in the art that the ease of implementing matched but scaled current sources to control the transfer of charge between switched capacitors is much more likely to yield a layout which works on first silicon than a matched capacitor array, thereby improving circuit yields. Current sources do not require the same level of parasitic extraction and capacitor array tweaking for parasitic non-idealities than is required to implement passive unit device implementations. Further, those skilled in the art will recognize the various combinations, alterations and implementations that might utilize this technique to replace those which came previously which could not decouple the charge transferred to specific capacitors within a switched capacitor circuit.

The foregoing description is illustrative of particular embodiments of the invention, but is not meant to be a limitation upon the practice thereof. The following claims, including all equivalents thereof, are intended to define the scope of the invention.

The invention claimed is:

1. A switched capacitor circuit comprising:
   two or more capacitors arranged in a switched capacitor circuit configuration;
   a comparison device comparing a node at an input of the comparison device whose potential varies with the charging of one or more of said switched capacitors;
   two or more current sources coupled to said two or more capacitors and to said comparator, wherein a first current source charges at least two of said capacitors switched together in series during the charge portion of a cycle, and a second current source having a current proportional to a current of the first current source charges at least one of but at least one fewer of said two or more capacitors coupled to the node of the comparison device through the switched capacitor circuit configuration during the charge portion of said cycle; and
   wherein said current sources are enabled at the beginning of said charge portion of said cycle, and said comparison device disables said current sources once said node reaches a reference potential.

2. The switched capacitor circuit of claim 1 wherein said switched capacitor circuit is a gain circuit created by discharging a capacitor from among said two or more capacitors during each cycle.

3. The switched capacitor circuit of claim 1 wherein said switched capacitor circuit is an integrator created by discharging a capacitor from among said two or more capacitors only once and then allowing said capacitor to charge during additional cycles.

4. The switched capacitor circuit of claim 1 wherein said switched capacitor circuit is a doubler.

5. The switched capacitor circuit of claim 1 wherein said switched capacitor circuit is used to synthesize a filter.

6. The switched capacitor circuit of claim 1 where said switched capacitor circuit is a gain circuit.

7. The switched capacitor circuit of claim 1 where said switched capacitor circuit is used to create a data converter.

8. The switched capacitor circuit of claim 1 further comprising a nuller circuit; and
   wherein errors related to non-idealities of said two or more current sources and said comparator are removed with said nuller circuit.

9. The switched capacitor circuit of claim 8 wherein:
   one or more additional switched capacitor branches are coupled to the comparison node and;
   wherein said nuller circuit imparts an offset charge to said branch or branches which is subtracted from said comparison node.

10. The switched capacitor circuit of claim 1 wherein finite propagation and metastability noise errors in said comparator are minimized by utilizing a fast comparator configuration.

11. The switched capacitor circuit of claim 1 further comprising a fast comparator and a slow comparator; and
    wherein finite propagation and metastability noise errors in said slow comparator are minimized by utilizing said slow comparator which then turns on a fast comparator, where said fast comparator minimizes said propagation delay and metastability noise errors.

12. A switched capacitor scaling circuit comprising;
    two or more current sources scaled relative to each other, a first current source from amongst said two or more current sources charging a series connection of two or more capacitors, a second current source from amongst said two or more current sources charging at least one fewer but at least one of said two or more capacitors as the series connected current source; and
    wherein said two or more current sources modify a sum of currents into a switched capacitor summing node until a common mode potential is reached but where said series connected capacitors accumulate different but proportional charges according to a ratio of the current source currents.

13. The switched capacitor scaling circuit of claim 12 wherein said two or more current sources are derived from the same bias source.

14. The switched capacitor scaling circuit of claim 12 wherein the magnitudes of current supplied by said one or more current sources are programmable.

15. The switched capacitor scaling circuit of claim 14 wherein said one or more current sources are derived from a current mirror array where a series of output branches of said current mirror array are summed to form said output current sources.

16. The switched capacitor scaling circuit of claim 14 wherein said programming is performed with an array of cascaded current sources for both p and n sources, derived from a single input bias where each of said cascaded current sources are enabled or disabled using digital control words to create proportional but programmable currents.

17. The switched capacitor scaling circuit of claim 14 wherein said one or more current sources have controlled duty cycles where the charge imparted each cycle by said one or more current sources is controlled by turning on at least one of said current sources after the other of said current sources where such current sources are either of the same magnitude or scaled relative to one another.

18. The switched capacitor circuit of claim 1, wherein the first current source and the second current source are scalable and used to modify a charge balance into the node of the comparison device through the switched capacitor circuit configuration.

19. The switched capacitor circuit of claim 1 wherein said second current source is used to discharge the node.

20. The switched capacitor circuit of claim 1 wherein the current of the second current source is proportionally smaller than the current of the first current source delaying a time for said node to reach said reference potential to disables said current sources, wherein the delay allows at least one of capacitor coupled to the node of the comparison device through the switched capacitor circuit configuration to charge to a higher voltage in proportion to the proportional currents producing a current programmed gain.

* * * * *